(12) United States Patent
Kurokawa et al.

(10) Patent No.: US 9,287,425 B2
(45) Date of Patent: Mar. 15, 2016

(54) PHOTODETECTOR, LIQUID CRYSTAL DISPLAY DEVICE, AND LIGHT-EMITTING DEVICE

(71) Applicant: Semiconductor Energy Laboratory Co., Ltd., Atsugi-shi, Kanagawa-ken (JP)

(72) Inventors: Yoshiyuki Kurokawa, Kanagawa (JP); Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 86 days.

(21) Appl. No.: 14/299,057

(22) Filed: Jun. 9, 2014

(65) Prior Publication Data

US 2014/0285755 A1 Sep. 25, 2014

Related U.S. Application Data

(63) Continuation of application No. 12/855,336, filed on Aug. 12, 2010, now Pat. No. 8,773,622.

(30) Foreign Application Priority Data

Aug. 21, 2009 (JP) ................................ 2009-191827

(51) Int. Cl.
*H01L 31/0232* (2014.01)
*G02F 1/1335* (2006.01)
(Continued)

(52) U.S. Cl.
CPC .... *H01L 31/02327* (2013.01); *G02F 1/133514* (2013.01); *H01L 27/1446* (2013.01);
(Continued)

(58) Field of Classification Search
CPC .................. H01L 2924/13091; H01L 27/144; H01L 27/1446; H01L 27/1464; H01L 27/14621; H01L 27/14623; H01L 27/14645; H01L 27/14643; H01L 27/14625; H01L 27/14692; H01L 27/14607; H01L 27/14665; H01L 27/3244; H01L 27/3269; H01L 29/78663; H01L 29/41733; H01L 29/51; H01L 29/66757; H01L 31/0216; H01L 31/02164; H01L 31/02327; H01L 31/0232; H01L 51/5284; G03F 7/0007; G09G 2300/0421; G09G 2300/0426; G09G 2300/0439; G09G 2300/08; G09G 2310/0275; G09G 2360/142; G09G 2360/144; G02F 1/133788; G02F 1/13338; G02F 1/1368; G02F 1/1335; G02F 1/133514; G02F 1/1306; G02F 1/133345; G02F 1/133512; G02F 1/134309; G02F 2001/13312; G02F 2201/58
USPC .......... 257/43, 432, 435, 292, 431, 447, 294, 257/443, 444, 460, 88; 438/70, 104, 66; 250/208.1; 349/106, 138, 42, 65, 50, 349/52, 43, 46, 61; 359/891
See application file for complete search history.

(56) References Cited

U.S. PATENT DOCUMENTS 5,473,453 A 12/1995 Kurematsu
5,666,176 A 9/1997 Kurematsu
(Continued)

FOREIGN PATENT DOCUMENTS

CN 101075626 A 11/2007
EP 2081081 A 7/2009
(Continued)

OTHER PUBLICATIONS

Taiwanese Office Action (Application No. 099126296) Dated Mar. 31, 2015.
(Continued)

*Primary Examiner* — Thoi Duong
(74) *Attorney, Agent, or Firm* — Fish & Richardson P.C.

(57) ABSTRACT

One embodiment of the present invention includes a first light-blocking layer and a second light-blocking layer which are over a light-transmitting substrate, a first photodiode over the first light-blocking layer, a second photodiode over the second light-blocking layer, a first color filter covering the first photodiode, a second color filter covering the second photodiode, and a third light-blocking layer formed using the first color filter and the second color filter and disposed between the first photodiode and the second photodiode.

20 Claims, 14 Drawing Sheets

(51) Int. Cl.
*H01L 27/144* (2006.01)
*H01L 31/0216* (2014.01)
*G02F 1/133* (2006.01)
*H01L 27/146* (2006.01)

(52) U.S. Cl.
CPC *H01L31/02164* (2013.01); *G02F 2001/13312* (2013.01); *H01L 27/14618* (2013.01); *H01L 27/14621* (2013.01); *H01L 2924/0002* (2013.01)

(56) References Cited

U.S. PATENT DOCUMENTS

| | | |
|---|---|---|
| 6,144,426 A | 11/2000 | Yamazaki et al. |
| 6,690,437 B2 | 2/2004 | Yamazaki et al. |
| 6,747,289 B2 | 6/2004 | Yamazaki et al. |
| 7,002,659 B1 | 2/2006 | Yamazaki et al. |
| 7,430,025 B2 | 9/2008 | Okamoto et al. |
| 7,605,354 B2 | 10/2009 | Koyama |
| 7,622,785 B2 | 11/2009 | Sasagawa et al. |
| 7,741,667 B2 | 6/2010 | Jung |
| 7,825,998 B2 | 11/2010 | Chen et al. |
| 7,847,361 B2 | 12/2010 | Kokusenya |
| 7,868,368 B2 | 1/2011 | Park |
| 8,013,955 B2 | 9/2011 | Katoh et al. |
| 8,035,590 B2 | 10/2011 | Kakinuma et al. |
| 8,053,816 B2 | 11/2011 | Arao et al. |
| 8,106,429 B2 | 1/2012 | Kim |
| 8,129,809 B2 | 3/2012 | Jang |
| 8,773,622 B2 | 7/2014 | Kurokawa et al. |
| 2002/0063518 A1 | 5/2002 | Okamoto et al. |
| 2002/0107055 A1 | 8/2002 | Yamazaki et al. |
| 2006/0131598 A1 | 6/2006 | Koh |
| 2006/0275944 A1 | 12/2006 | Hyun |
| 2007/0113886 A1 | 5/2007 | Arao et al. |
| 2007/0155083 A1 | 7/2007 | Park |
| 2007/0210344 A1 | 9/2007 | Arao et al. |
| 2009/0057725 A1 | 3/2009 | Kim |
| 2009/0141004 A1 | 6/2009 | Yamazaki |
| 2009/0161047 A1 | 6/2009 | Cho et al. |
| 2009/0174647 A1 | 7/2009 | Chen et al. |
| 2009/0325338 A1 | 12/2009 | Jung |
| 2010/0007632 A1 | 1/2010 | Yamazaki |
| 2010/0117991 A1 | 5/2010 | Koyama et al. |
| 2011/0043735 A1 | 2/2011 | Kozuma et al. |

FOREIGN PATENT DOCUMENTS

| | | |
|---|---|---|
| JP | 05-313153 A | 11/1993 |
| JP | 2005-010690 A | 1/2005 |
| JP | 2005-353799 A | 12/2005 |
| JP | 2007-311664 A | 11/2007 |
| JP | 5553707 | 7/2014 |
| TW | 200931118 | 7/2009 |
| WO | WO-2008/044369 | 4/2008 |

OTHER PUBLICATIONS

Chinese Office Action (Application No. 201010260696.3) Dated Apr. 3, 2014.

ated in Japan as Serial No. 2009-191827 on Aug. 21, 2009, both of which are incorporated by reference.

PHOTODETECTOR, LIQUID CRYSTAL DISPLAY DEVICE, AND LIGHT-EMITTING DEVICE

CROSS-REFERENCE TO RELATED APPLICATIONS

This application is a continuation of U.S. application Ser. No. 12/855,336, filed Aug. 12, 2010, now allowed, which claims the benefit of a foreign priority application filed in Japan as Serial No. 2009-191827 on Aug. 21, 2009, both of which are incorporated by reference.

BACKGROUND OF THE INVENTION

1. Field of the Invention

The present invention relates to a photodetector including a photodiode, a liquid crystal display device including a photodiode, and a light-emitting device including a photodiode.

2. Description of the Related Art

Patent Document 1 discloses a liquid crystal display device having an input function using a photosensor. Specifically, the liquid crystal display device includes a switching element and a photoelectric conversion element over a light-transmitting substrate. The thickness of the light-transmitting substrate is 70 to 100 μm. The light-transmitting substrate having such a thickness prevents stray light from a backlight from entering the photoelectric conversion element.

REFERENCE

[Patent Document 1] Japanese Published Patent Application No. 2005-10690

SUMMARY OF THE INVENTION

However, it is difficult to prevent light from a backlight from entering photoelectric conversion element (a photodiode) by only making the light-transmitting substrate thin. Besides, part of light from an object (oblique light) enters not a desired photoelectric conversion element but a photoelectric conversion element in the adjacent pixel. Oblique light incidence lowers the light sensitivity of the photoelectric conversion element.

One embodiment of the present invention prevents light from a backlight from entering a photodiode and prevents oblique light from an object from entering not a desired photodiode but another photodiode.

First Mode of the present invention is a photodetector including a first light-blocking layer and a second light-blocking layer over a light-transmitting substrate; a first photodiode over the first light-blocking layer; a second photodiode over the second light-blocking layer; a first color filter covering the first photodiode; a second color filter covering the second photodiode; and a third light-blocking layer formed using the first color filter and the second color filter and disposed between the first photodiode and the second photodiode.

In the photodetector which is First Mode of the present invention, light from under the first photodiode is blocked by the first light-blocking layer, and light from under the second photodiode is blocked by the second light-blocking layer. In addition, oblique light from an object is blocked by the third light-blocking layer. The first photodiode and the second photodiode can accurately detect light to be detected; thus, the light sensitivity of the first photodiode and the second photodiode can be improved.

Second Mode of the present invention is a photodetector including a first light-blocking layer and a second light-blocking layer over a light-transmitting substrate; a light-transmitting insulating film over and in contact with the light-transmitting substrate, the first light-blocking layer, and the second light-blocking layer; a first photodiode over the first light-blocking layer with the light-transmitting insulating film interposed therebetween; a second photodiode over the second light-blocking layer with the light-transmitting insulating film interposed therebetween; a first color filter covering the first photodiode; and a second color filter covering the second photodiode. A third light-blocking layer formed using the first color filter and the second color filter arranged side by side is formed between the first photodiode and the second photodiode. The third light-blocking layer is formed over and in contact with the light-transmitting insulating film. The third light-blocking layer formed over and in contact with the light-transmitting insulating film can reliably block oblique light.

First Mode and Second Mode of the present invention can each include a first reflecting layer and a second reflecting layer instead of the first light-blocking layer and the second light-blocking layer. Light from under the first photodiode and light from under the second photodiode are reflected off the first reflecting layer and the second reflecting layer, and thus are not detected by the first photodiode and the second photodiode. In addition, even when light from an object is not detected by the first photodiode or the second photodiode, the light from the object is easily detected by the first photodiode or the second photodiode because the light from the object is reflected off the first reflecting layer or the second reflecting layer.

Third Mode of the present invention is a liquid crystal display device including a first light-blocking layer and a second light-blocking layer over a first light-transmitting substrate; a first photodiode over the first light-blocking layer; a second photodiode over the second light-blocking layer; a first color filter covering the first photodiode; a second color filter covering the second photodiode; a third light-blocking layer formed using the first color filter and the second color filter and disposed between the first photodiode and the second photodiode; a liquid crystal layer over the first color filter and the second color filter; and a second light-transmitting substrate over the liquid crystal layer. Third Mode of the present invention includes a photodetection portion including a first light-blocking layer, a second light-blocking layer, a third light-blocking layer, a first photodiode, a second photodiode, a first color filter, and a second color filter; and a display portion including a liquid crystal layer. A display device with a touch panel is made by combining the photodetection portion and the display portion. Light from under the first photodiode and light from under the second photodiode are blocked by the first light-blocking layer and the second light-blocking layer, respectively. Further, oblique light from an object is blocked by the third light-blocking layer. The first photodiode and the second photodiode can accurately detect light to be detected; the light sensitivity of the first photodiode and the second photodiode can be improved.

Fourth Mode of the present invention is a liquid crystal display device including a first light-blocking layer and a second light-blocking layer over a first light-transmitting substrate; a light-transmitting insulating film over and in contact with the first light-transmitting substrate, the first light-blocking layer, and the second light-blocking layer; a first photodiode over the first light-blocking layer with the light-transmitting insulating film interposed therebetween; a second photodiode over the second light-blocking layer with the light-transmitting insulating film interposed therebetween; a first color filter covering the first photodiode; a second color filter covering the second photodiode; a liquid crystal layer over the first color filter and the second color filter; and a second light-transmitting substrate over the liquid crystal layer. A third light-blocking layer formed using the first color filter and the second color filter arranged side by side is formed between the first photodiode and the second photodiode. The third light-blocking layer is formed over and in contact with the light-transmitting insulating film. The third light-blocking layer formed over and in contact with the light-transmitting insulating film can reliably block oblique light.

Third Mode and Fourth Mode of the present invention can each include a first reflecting layer and a second reflecting layer instead of the first light-blocking layer and the second light-blocking layer. Thus, light from under the first photodiode and light from under the second photodiode are not detected and light from an object can be reliably detected.

In Third Mode and Fourth Mode of the present invention, the thickness of the second light-transmitting substrate can be 70 to 100 μm. Thus, multiple reflection in the second light-transmitting substrate can be prevented.

Fifth Mode of the present invention is a light-emitting device including a first photodiode, a second photodiode and a light-emitting layer over a substrate; and a first color filter or second color filter over the light-emitting layer. The first color filter covers the first photodiode. The second color filter covers the second photodiode. A light-blocking layer formed using the first color filter and the second color filter is disposed between the first photodiode and the second photodiode. A display device with a touch panel is made by combining a photodetector and a light-emitting device. Oblique light from an object is blocked by the light-blocking layer. The first photodiode and the second photodiode can accurately detect light to be detected; thus, the light sensitivity of the first photodiode and the second photodiode can be improved. Further, a backlight becomes unnecessary.

Sixth Mode of the present invention is a light-emitting device including an insulating film over a substrate; a first photodiode, a second photodiode and a light-emitting layer over the substrate; and a first color filter or second color filter over the light-emitting layer. The first color filter covers the first photodiode. The second color filter covers the second photodiode. A light-blocking layer formed using the first color filter and the second color filter arranged side by side is formed between the first photodiode and the second photodiode. The light-blocking layer is formed over and in contact with the insulating film. The light-blocking layer formed over and in contact with the insulating film can reliably block oblique light.

In each of Fifth Mode and Sixth Mode of the present invention, a first light-blocking layer and a second light-blocking layer can be provided over the substrate, the first photodiode can be formed over the first light-blocking layer with the insulating film interposed therebetween, and the second photodiode can be formed over the second light-blocking layer with the insulating film interposed therebetween. When the multiple reflection of light from the light-emitting layer occurs, light from under the first photodiode and light from under the second photodiode can be prevented from being detected by the first photodiode and the second photodiode, respectively.

Fifth Mode and Sixth Mode of the present invention can each include a first reflecting layer and a second reflecting layer instead of the first light-blocking layer and the second light-blocking layer. Thus, light from under the first photodiode and light from under the second photodiode are not detected and light from an object can be reliably detected.

The light-blocking layer between the first photodiode and the second photodiode allows the light from an object to be accurately detected and improves the light sensitivity of the first photodiode and the second photodiode.

DETAILED DESCRIPTION OF THE INVENTION

Figure 1:
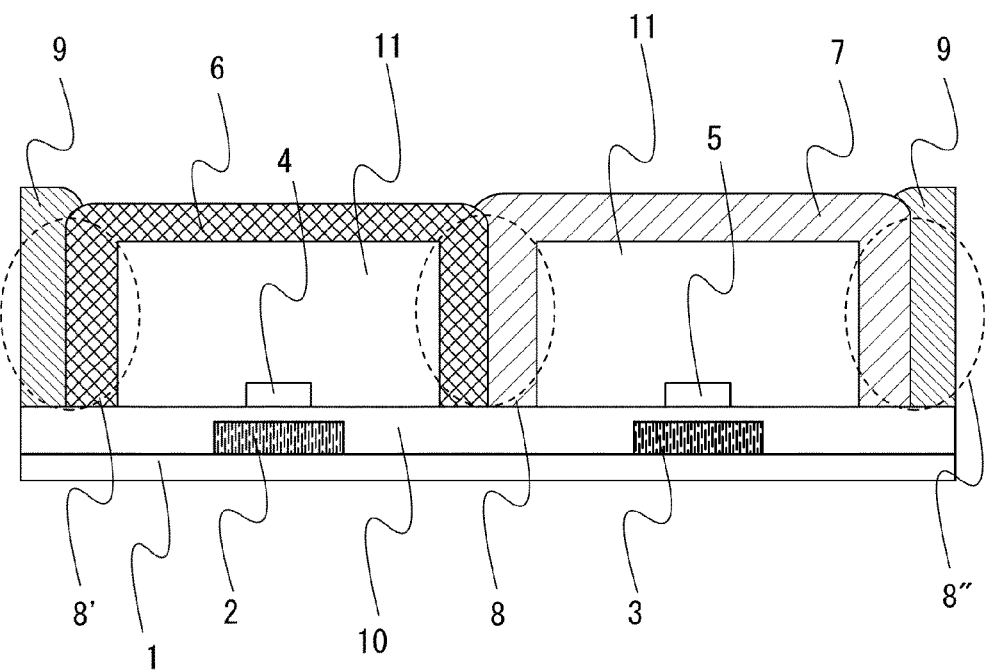
FIG. 1 is a diagram showing Embodiment 1 which is one embodiment of the present invention.

Embodiments of the present invention will be described below. However, the present invention can be carried out in many different modes, and it is easily understood by those skilled in the art that modes and details of the present invention can be modified in various ways without departing from the spirit and the scope of the present invention. Therefore, the present invention should not be construed as being limited to description of the embodiments. Note that the same reference numerals are commonly given to the same portions or portions having similar functions in different drawings, and repetitive description will be omitted in some cases.

(Embodiment 1)

A photodetector which is one embodiment of the present invention will be described (FIG. 1). FIG. 1 is a cross-sectional view of the photodetector.

The photodetector which is one embodiment of the present invention includes a first light-blocking layer 2 and a second light-blocking layer 3 over a light-transmitting substrate 1, a first photodiode 4 over the first light-blocking layer, a second photodiode 5 over the second light-blocking layer 3, a first color filter 6 covering the first photodiode 4, and a second color filter 7 covering the second photodiode 5. The photodetector includes a third light-blocking layer 8 formed using the first color filter 6 and the second color filter 7 and disposed between the first photodiode 4 and the second photodiode 5.

The third light-blocking layer 8 is formed using the first color filter 6 and the second color filter 7 which are arranged side by side. In other words, the third light-blocking layer 8 is formed using one end of the first color filter 6 and one end of the second color filter 7 which overlap each other in a direction in which oblique light (described later) travels. A portion where the first color filter 6 and the second color filter 7 are arranged side by side, i.e. a portion where the first color filter 6 and the second color filter 7 overlap each other is the third light-blocking layer 8. In the third light-blocking layer 8, the first color filter 6 and the second color filter 7 can be in contact with each other.

A third light-blocking layer 8' formed using a third color filter 9 and the first color filter 6 can be provided on the other side of where the third light-blocking layer 8 between the first photodiode 4 and the second photodiode 5 is provided, and on the first photodiode 4 side. A portion where one end of the third color filter 9 and the other end of the first color filter 6 are arranged side by side is the third light-blocking layer 8'. In addition, a third light-blocking layer 8" formed using the third color filter 9 and the second color filter 7 can be provided on the second photodiode 5 side. A portion where one end of the third color filter 9 and the other end of the second color filter 7 are arranged side by side is the third light-blocking layer 8".

A first light-transmitting insulating film 10 can be provided so as to be over and in contact with the light-transmitting substrate 1, the first light-blocking layer, and the second light-blocking layer. The first photodiode 4 can be formed over the first light-blocking layer with the first light-transmitting insulating film 10 interposed therebetween. The second photodiode 5 can be formed over the second light-blocking layer with the first light-transmitting insulating film 10 interposed therebetween. The third light-blocking layer 8 can be formed so as to be in contact with the first light-transmitting insulating film 10.

A second light-transmitting insulating film 11 can be formed over the first light-transmitting insulating film 10, the first photodiode 4, and the second photodiode 5. The first color filter 6 can be formed over the first photodiode 4 with the second light-transmitting insulating film 11 interposed therebetween. The second color filter 7 can be formed over the second photodiode 5 with the second light-transmitting insulating film 11 interposed therebetween. When the second light-transmitting insulating film 11 is formed, the third light-blocking layer 8 is formed so as to fill a groove in the second light-transmitting insulating film 11.

Figure 2:
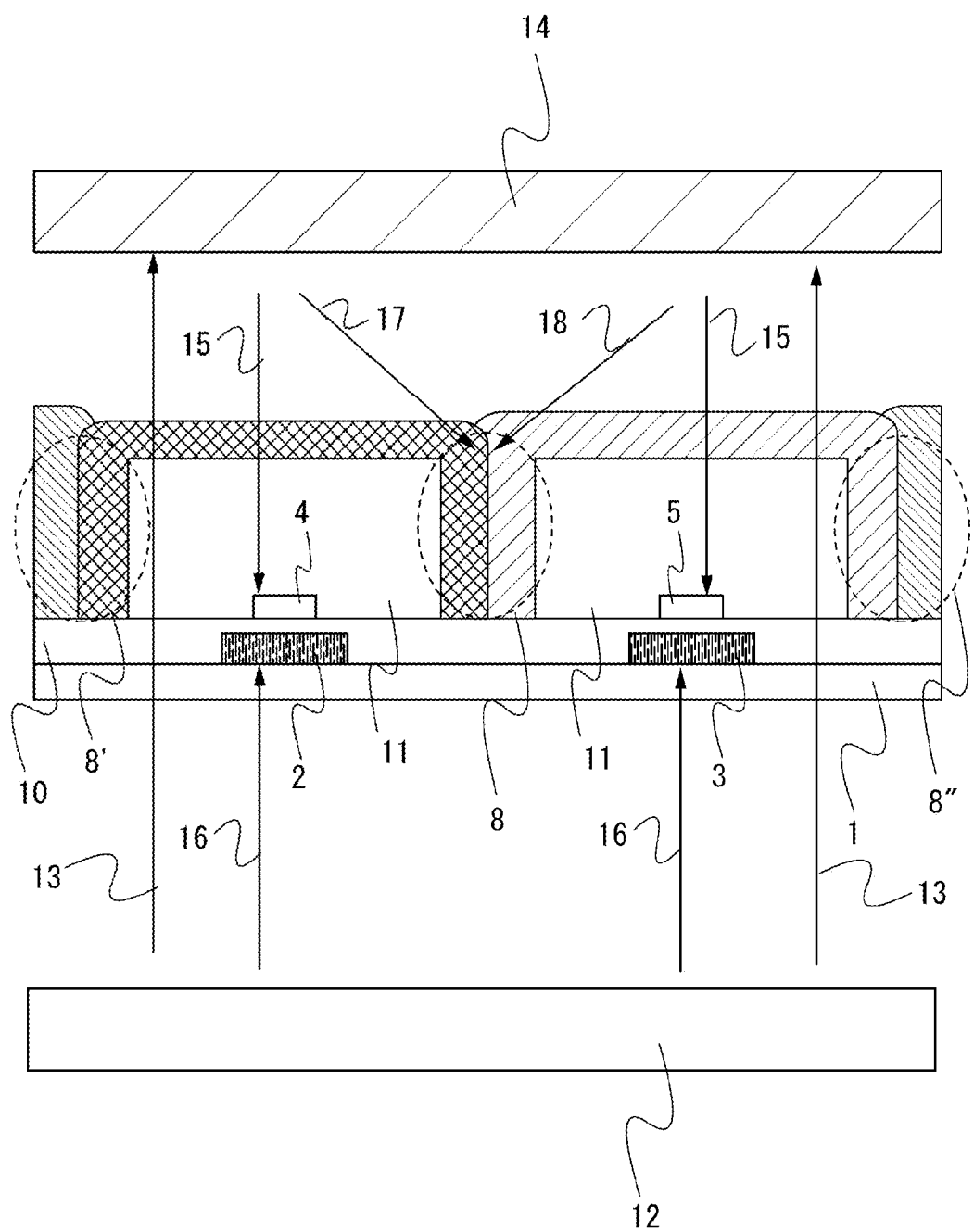
FIG. 2 is a diagram showing Embodiment 1 which is one embodiment of the present invention.

A method of detecting light will be described below (FIG. 2). Light 13 emitted from a backlight 12 below the light-transmitting substrate 1 passes through the light-transmitting substrate 1 and the first color filter 6 or the second color filter 7 and is reflected off an object 14. A reflected light 15 is detected by the first photodiode 4 or the second photodiode 5. Detected light is extracted via an extracting electrode (not illustrated) of the first photodiode 4 or second photodiode 5 to be an electric signal.

Part of the light 13 from the backlight 12 becomes light 16 heading to the first photodiode 4 and the second photodiode 5. However, the light 16 is blocked by the first light-blocking layer 2 and the second light-blocking layer 3. Therefore, the light 16 does not enter the first photodiode 4 and the second photodiode 5 and hence is not detected, while in a structure in Patent Document 1, it is possible that the light 16 is detected by the first photodiode 4 and the second photodiode 5 because the first light-blocking layer 2 and the second light-blocking layer 3 are not provided. Further, the multiple reflection of light from the backlight 12 which occurs in the light-transmitting substrate 1 does not cause the light to enter and to be detected by the first photodiode 4 and the second photodiode 5 because of the first light-blocking layer 2 and the second light-blocking layer 3.

Part of reflected light from the object 14 becomes oblique light 17 and oblique light 18. Each of the oblique light 17 and the oblique light 18 is oblique light. The oblique light 17 heads to the second photodiode 5 obliquely from above the second photodiode 5. The oblique light 18 heads to the first photodiode 4 obliquely from above the second photodiode 5. However, the oblique light 17 is blocked by the third light-blocking layer 8. Thus, the oblique light 17 does not enter the second photodiode 5, and hence is not detected. Further, the oblique light 18 is blocked by the third light-blocking layer 8. Thus, the oblique light 18 does not enter the first photodiode 4, and hence is not detected. Meanwhile, in the structure in Patent Document 1, the third light-blocking layer 8 is not provided, so that the oblique light 17 is detected by the second photodiode 5 and the oblique light 18 is detected by the first photodiode 4.

The third light-blocking layer 8 between the first photodiode 4 and the second photodiode 5 is formed using the first color filter 6 and the second color filter 7 which are arranged side by side. The third light-blocking layer 8 can be formed using a metal film or a resin film that has a black material dispersed or black fine particles dispersed. In that case, however, the number of types of the material for the third light-blocking layer 8 is increased, causing the increase in the number of steps for making the third light-blocking layer 8. For one embodiment of the present invention, the third light-blocking layer is formed using the first color filter 6 and the second color filter 7 which are arranged side by side, so that the number of types of material and the number of fabrication steps are not increased. In addition, the light 13 can be colored by the first color filter 6, the second color filter 7, and the third color filter 9, allowing the photodetector to be used as a color sensor.

The first photodiode 4 and the second photodiode 5 are formed over and in contact with the first light-transmitting insulating film 10, and the third light-blocking layer is formed over and in contact with the first light-transmitting insulating film 10, whereby the oblique lights 17 and 18 are reliably blocked.

The first light-blocking layer 2 and the second light-blocking layer 3 can be a first reflecting layer 2 and a second reflecting layer 3. In this case, the light 16 from the backlight 12 is reflected off the first reflecting layer 2 and the second reflecting layer 3, and hence is not detected by the first photodiode 4 and the second photodiode 5.

Further, even when the light 15 from the object 14 has not been detected by the first photodiode 4 or the second photodiode 5, the light is reflected off the first reflecting layer 2 or the second reflecting layer 3, allowing the light from the object 14 to be detected more easily by the first photodiode 4 or the second photodiode 5.

The elements of the photodetector will be described below.
(1) the Light-transmitting Substrate 1

The light-transmitting substrate 1 transmits visible light and preferably has a thickness of 10 to 200 μm. For example, a plastic substrate that has flexibility and transmits visible light, or a light-transmitting substrate made of inorganic material, which transmits visible light can be used. Examples of the material for the plastic substrate include polyester typified by polyethylene terephthalate (PET); polyether sulfone (PES); polyethylene naphthalate (PEN); polycarbonate (PC); polyether ether ketone (PEEK); polysulfone (PSF); polyetherimide (PEI); polyarylate (PAR); polybutylene terephthalate (PBT); polyimide; acrylonitrile butadiene styrene resin; poly vinyl chloride; polypropylene; poly vinyl acetate; and acrylic resin. Examples of the substrate made of inorganic material include glass substrates and quartz substrates.

(2) The First Light-blocking Layer 2 and the Second Light-blocking Layer 3

The first light-blocking layer 2 prevents the light 16 from the backlight 12 from entering the first photodiode 4. The second light-blocking layer 3 prevents the light 16 from the backlight 12 from entering the second photodiode 5. The first light-blocking layer 2 and the second light-blocking layer 3 can be island-shaped. The first light-blocking layer 2 and the second light-blocking layer 3 are formed using a light-blocking material, by sputtering, CVD, or coating. For example, a material mainly containing chromium, resin containing a carbon black, or resin containing a black pigment such as titanium lower oxide whose oxidation number is smaller than that of titanium dioxide can be used as a light-blocking material. In the case where the first light-blocking layer 2 and the second light-blocking layer 3 are used as reflecting layers, they are formed using aluminum or the like.

(3) The First Photodiode 4 and the Second Photodiode 5

The first photodiode 4 and the second photodiode 5 detect the light 15 from the object 14. The first photodiode 4 and the second photodiode 5 are PIN or PN diodes. The first photodiode 4 and the second photodiode 5 are formed using semiconductor films. A PIN diode includes a region of p-type conductivity (p-type layer), a region of i-type conductivity (i-type layer), and a region of n-type conductivity (n-type layer). A PN diode includes a p-type layer and an n-type layer. A p-type layer, an n-type layer, an i-type layer are formed using films made of semiconductor such as silicon or formed using oxide semiconductor films containing ZnO or the like. The semiconductor film can have any of amorphous, microcrystalline, crystalline, and single crystalline structures.

(4) The First Color Filter 6, the Second Color Filter 7, and the Third Color Filter 9

The colors of the first color filter 6, the second color filter 7, and the third color filter 9 are different, and each can be any of red, blue, and green. These color the light 13 from the backlight. A colored light is reflected off the object 14 to be the light 15. The light 15 passes through the first color filter 6 or the second color filter 7, and then is detected by the first photodiode 4 or the second photodiode 5. The first color filter 6, the second color filter 7, and the third color filter 9 are formed in island shapes. The first color filter 6 is formed so as to cover the top surface and the sides of the first photodiode 4, and the second color filter 7 is formed so as to cover the top surface and the sides the second photodiode 5.

The first color filter 6, the second color filter 7, and the third color filter 9 can be selectively formed by photolithography and etching, after being coated with an organic resin such as a polyimide-based resin and an acrylic-based resin in which pigment is dispersed. Alternatively, the first color filter 6, the second color filter 7, and the third color filter 9 can be selectively formed by a droplet discharge method such as an inkjet method.

(5) The Third Light-blocking Layer 8

The third light-blocking layer 8 prevents the oblique lights 17 and 18 included in a reflected light from the object 14 from being detected by the second photodiode 5 and the first photodiode 4. The third light-blocking layer 8 between the first photodiode 4 and the second photodiode 5 is formed, as described above, using the first color filter 6 and the second color filter 7 arranged side by side. After one of the first color filter 6 and the second color filter 7 is selectively formed, the other one of the first color filter 6 and the second color filter 7 is selectively formed such that the first color filter 6 and the second color filter 7 are arranged side by side.

(6) The First Light-Transmitting Insulating Film 10 and the Second Light-Transmitting Insulating Film 11

The first light-transmitting insulating film 10 prevents alkali metal such as Na or alkaline earth metal contained in the light-transmitting substrate 1 from being diffused into the first photodiode 4 and the second photodiode 5 and adversely affecting the characteristics. The first light-transmitting insulating film 10 is formed using an insulating material such as silicon oxide, silicon nitride, silicon oxynitride, or silicon nitride oxide, by CVD, sputtering, or the like. The second light-transmitting insulating film prevents alkali metal such as Na or alkaline earth metal from outside from being diffused into the first photodiode 4 and the second photodiode 5 and adversely affecting the characteristics. Each of the first light-transmitting insulating film 10 and the second light-transmitting insulating film 11 is a single-layer or multilayer film of any of the following films: a silicon oxide film; a silicon oxynitride film; a silicon nitride oxide film; an organic resin film; and the like, formed by plasma CVD, sputtering, or the like.

A method of fabricating the photodetector will be described below.

Figure 3A:
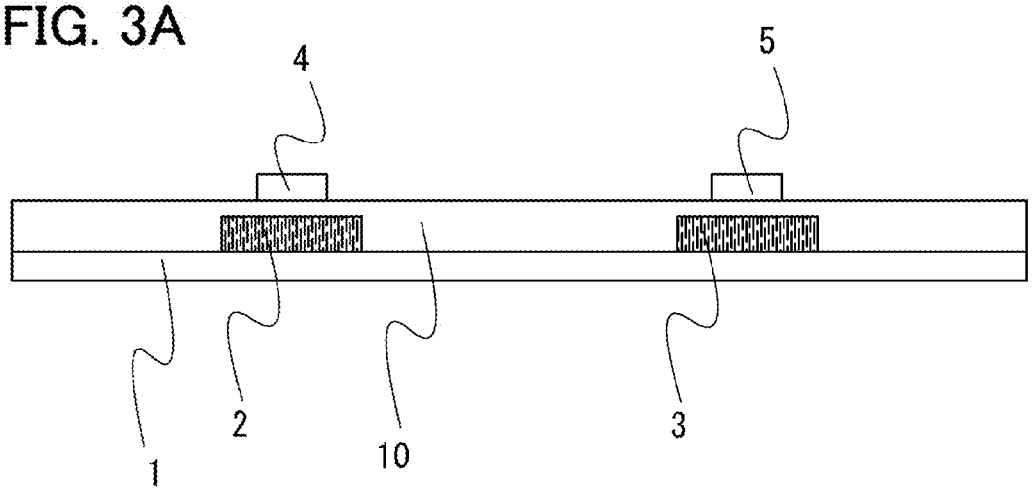
FIGS. 3A to 3C are diagrams showing Embodiment 1 which is one embodiment of the present invention.

A light-blocking film is formed using a light-blocking material over the light-transmitting substrate 1, by sputtering, CVD, or coating (not illustrated). The light-blocking film is processed by photolithography and etching, forming the first light-blocking layer 2 and the second light-blocking layer 3 (FIG. 3A). The first light-blocking layer 2 and the second light-blocking layer 3 can be formed over the light-transmitting substrate 1, by selectively applying a light-blocking material, using a droplet discharge method, the light-transmitting substrate 1. A light-transmitting insulating film is formed over the light-transmitting substrate 1, and the first light-blocking layer 2 and the second light-blocking layer 3 can be formed over the insulating film.

In the case of the first light-blocking layer 2 and the second light-blocking layer 3 are used as the first reflecting layer and the second reflecting layer, the first reflecting layer and the second reflecting layer are formed as follows: a reflecting film of aluminum or the like is formed by sputtering, CVD, or coating and processed by photolithography and etching.

The first light-transmitting insulating film 10 is formed over the light-transmitting substrate 1, the first light-blocking layer 2, and the second light-blocking layer 3 by sputtering, CVD, or coating (FIG. 3A). The first light-transmitting insulating film 10 can be a single-layer or multilayer film.

The first photodiode 4 and the second photodiode 5 are formed over the first light-transmitting insulating film 10 (FIG. 3A).

Figure 3B:
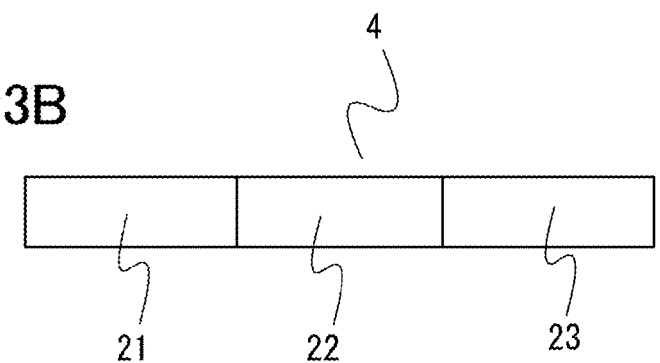
Figure 3C:
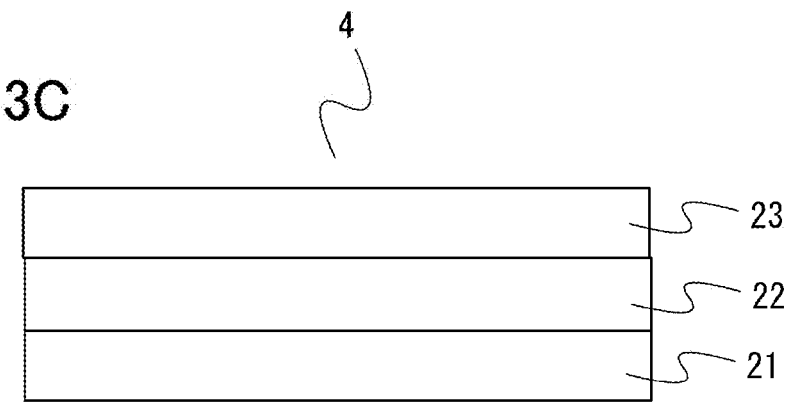
Figure 4A:
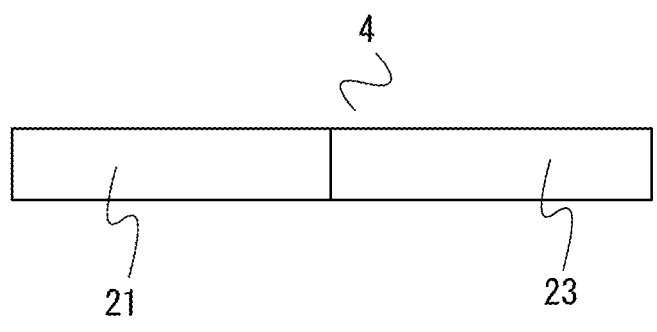
FIGS. 4A and 4B are diagrams showing Embodiment 1 which is one embodiment of the present invention.
Figure 4B:
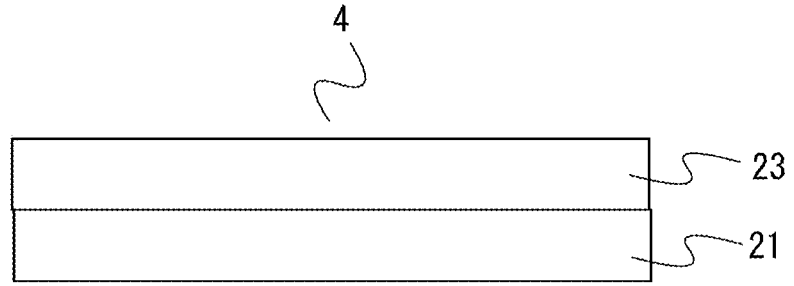

The first photodiode 4 and the second photodiode 5 are PIN diodes or PN diodes. The PIN diodes can be lateral diodes (FIG. 3B) or vertical diodes (FIG. 3C). Similarly, the PN diodes can be lateral diodes (FIG. 4A) or vertical diodes (FIG. 4B). The lateral diode is formed as follows: a p-type layer 21, an i-type layer 22, and an n-type layer 23 are formed in the semiconductor film by ion doping or the like. The vertical diode is formed in the following order: the p-type layer 21 is formed using a p-type semiconductor film, the i-type layer 22 is formed using an i-type semiconductor film, and the n-type layer 23 is formed using an n-type semiconductor film. It is also acceptable that the vertical diode is formed in the following order: the n-type layer 23 is formed, the i-type layer 22 is formed, and the p-type layer 21 is formed. Each of the p-type layer 21 and the n-type layer 23 is provided with an extracting electrode (not illustrated).

Figure 5A:
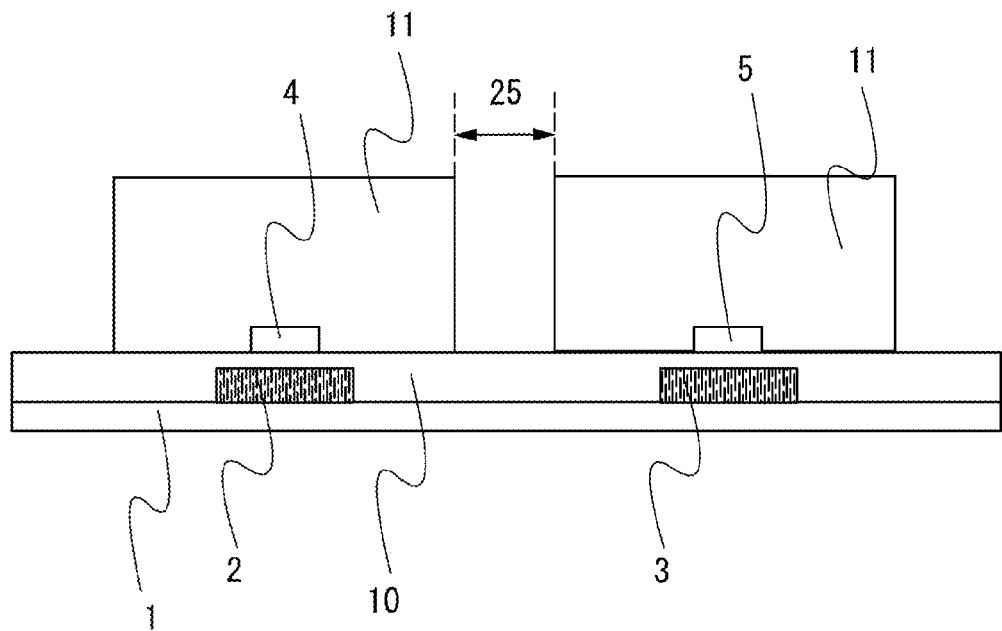
FIGS. 5A and 5B are diagrams showing Embodiment 1 which is one embodiment of the present invention.

A light-transmitting insulating film is formed over the first light-transmitting insulating film 10, the first photodiode 4, and the second photodiode 5 (not illustrated). The second light-transmitting insulating film 11 is formed by processing the insulating film by photolithography and etching (FIG. 5A). A space 25 is made adequately large because the first color filter 6 and the second color filter 7 are arranged side by side between the first photodiode 4 and the second photodiode 5 to form the third light-blocking layer.

Figure 5B:
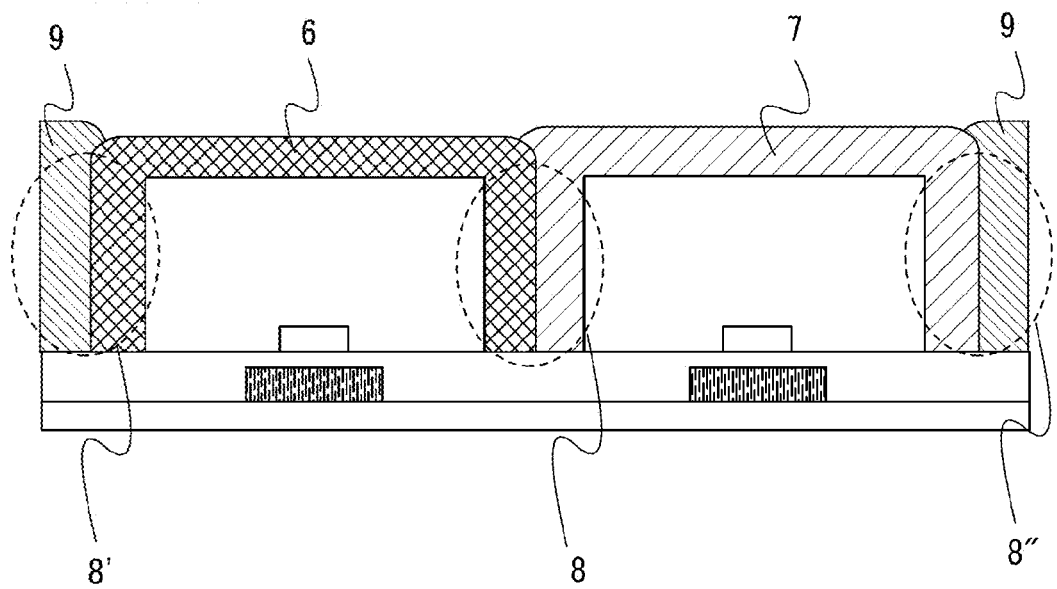

After an application of an organic resin in which pigment is dispersed, the organic resin is processed by photolithography and etching to form the first color filter 6. Next, after an application of an organic resin in which pigment of a color different from that of the first color filter 6 is dispersed, the organic resin is processed by photolithography and etching to form the second color filter 7. The first color filter 6 and the second color filter 7 are arranged side by side between the first photodiode 4 and the second photodiode 5 to form the third light-blocking layer 8. Lastly, after an application of an organic resin in which pigment of a color different from that of the first color filter 6 and the second color filter 7 is dispersed, the organic resin is processed by photolithography and etching to form the third color filter 9. The first color filter 6 and the third color filter 9 are arranged side by side to form the light-blocking layer 8'. The second color filter 7 and the third color filter 9 are arranged side by side to form the third light-blocking layers 8" (FIG. 5B). The first color filter 6, the second color filter 7, and the third color filter 9 can be formed by a droplet discharge method such as an inkjet method without photolithography and etching. The photodetector can be fabricated in such a manner.

(Embodiment 2)

Figure 6:
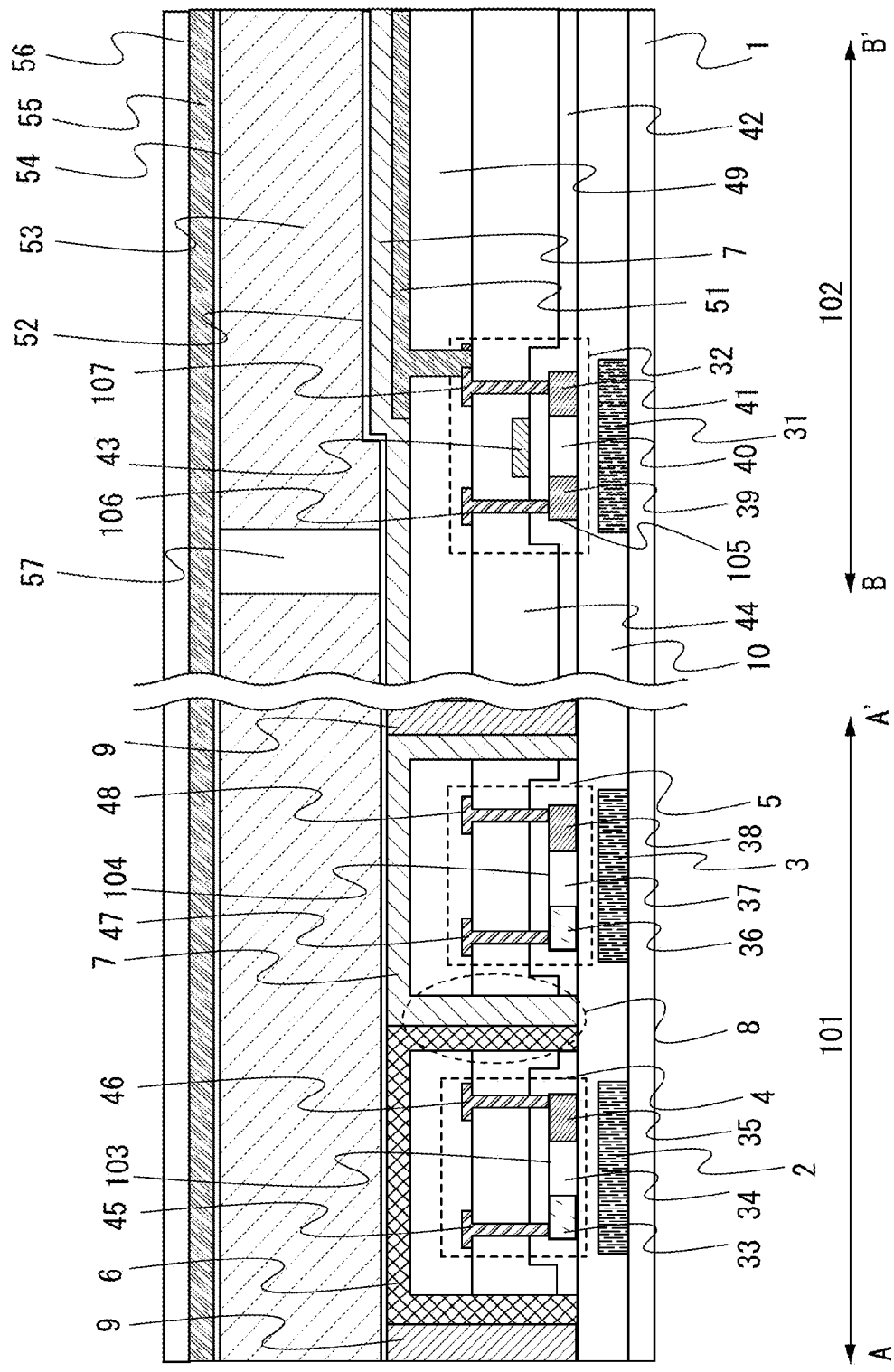
FIG. 6 is a diagram showing Embodiment 2 which is one embodiment of the present invention.

A liquid crystal display device which is one embodiment of the present invention will be described (FIG. 6). FIG. 6 is a cross-sectional view of the liquid crystal display device.

The liquid crystal display device which is one embodiment of the present invention includes the first light-blocking layer 2 and the second light-blocking layer 3 which are over the first light-transmitting substrate 1, the first photodiode 4 over the first light-blocking layer 2, the second photodiode 5 over the second light-blocking layer 3, the first color filter 6 covering the first photodiode 4, and the second color filter 7 covering the second photodiode 5. The liquid crystal display device includes the third light-blocking layer 8 formed using the first color filter 6 and the second color filter 7, between the first photodiode 4 and the second photodiode 5. Further, the liquid crystal display device includes a liquid crystal layer 53 over the first color filter 6 and the second color filter 7, and a second light-transmitting substrate 56 over the liquid crystal layer 53.

The liquid crystal display device in FIG. 6 includes a photodetection portion 101 and a display portion 102.

The photodetection portion 101 has the same structure as the photodetector in Embodiment 1. The first photodiode 4 and the second photodiode 5 are lateral PIN diodes. It is also acceptable that the first photodiode 4 and the second photodiode 5 are vertical diodes. Further it is also acceptable that the first photodiode 4 and the second photodiode 5 are PN diodes.

The first photodiode 4 includes a semiconductor layer 103 including a p-type layer 33, an i-type layer 34, and an n-type layer 35; and electrodes 45 and 46. The second photodiode 5 includes a semiconductor layer 104 including a p-type layer 36, an i-type layer 37, and an n-type layer 38; and electrodes 47 and 48.

The electrodes 45 and 46 are formed over a light-transmitting insulating film 44, and are connected to the semiconductor layer 103 via contact holes formed in a light-transmitting insulating film 42 and the light-transmitting insulating film 44. The electrodes 47 and 48 are formed in a similar manner.

A light-transmitting insulating film 49 is formed over the light-transmitting insulating film 44 and the electrodes 45 to 48. The first color filter 6, the second color filter 7, and the third color filter 9 are formed over the light-transmitting insulating film 49. The light-transmitting insulating films 42, 44, and 49 correspond to the second light-transmitting insulating film 11 in Embodiment 1.

As in Embodiment 1, the first light-blocking layer 2 is formed below the first photodiode 4. The second light-blocking layer 3 is formed below the second photodiode 5. As in Embodiment 1, the first light-blocking layer 2 and the second light-blocking layer 3 can be the first reflecting layer 2 and the second reflecting layer 3.

Further, as in Embodiment 1, the third light-blocking layer 8 formed using the first color filter 6 and the second color filter 7 is formed between the first photodiode 4 and the second photodiode 5. The third light-blocking layer 8 is formed using the first color filter 6 and the second color filter 7 which are arranged side by side. In other words, the third light-blocking layer 8 is formed using one end of the first color filter 6 and one end of the second color filter 7 which overlap each other in a direction in which oblique light travels. A portion where the first color filter 6 and the second color filter 7 are arranged side by side, i.e. a portion where the first color filter 6 and the second color filter 7 overlap each other is the third light-blocking layer 8. In the third light-blocking layer 8, the first color filter 6 and the second color filter 7 can be in contact with each other. The third light-blocking layer 8 is formed so as to fill a groove in the light-transmitting insulating films 42, 44, and 49. In addition, when the third light-blocking layer 8 is formed so as to be in contact with the first light-transmitting insulating film 10, oblique light from an object is not detected by the first photodiode 4 or the second photodiode 5.

The display portion 102 includes, over the light-transmitting substrate (the first light-transmitting substrate) 1, a light-blocking layer 31, a transistor 32 which is over the light-blocking layer 31, a pixel electrode 51 connected to the transistor 32, and the second color filter 7 which is over the pixel electrode 51.

The display portion 102 includes an alignment film 52, the liquid crystal layer 53, an alignment film 54, a counter electrode 55, and the light-transmitting counter substrate (the second light-transmitting substrate) 56, over the first color filter 6, the second color filter 7, and the third color filter 9. A spacer 57 maintains a uniform thickness of the liquid crystal layer 53. Each of the light-transmitting substrate 1 and the second light-transmitting substrate 56 is provided with a polarizing film (not illustrated). Each of the light-transmitting substrate 1 and the second light-transmitting substrate 56 can also be provided with a retardation film or the like.

The transistor 32 is an n-type or p-type transistor and includes a semiconductor layer 105 including a source region 39, a channel formation region 40, and a drain region 41; the light-transmitting insulating film (gate insulating film) 42; a gate electrode 43; a source electrode 106; and a drain electrode 107. In addition, although the light-blocking layer 31 is formed below the transistor 32, the light-blocking layer can be formed over the transistor 32 instead. Although a top-gate transistor is shown in FIG. 6, a bottom-gate transistor can be used instead. In addition, a structure with an LDD or the like can be used.

The source electrode 106 and the drain electrode 107 are formed over the light-transmitting insulating film 44, and are connected to the semiconductor layer 105 via contact holes formed in the light-transmitting insulating films 42 and 44.

Figure 7:
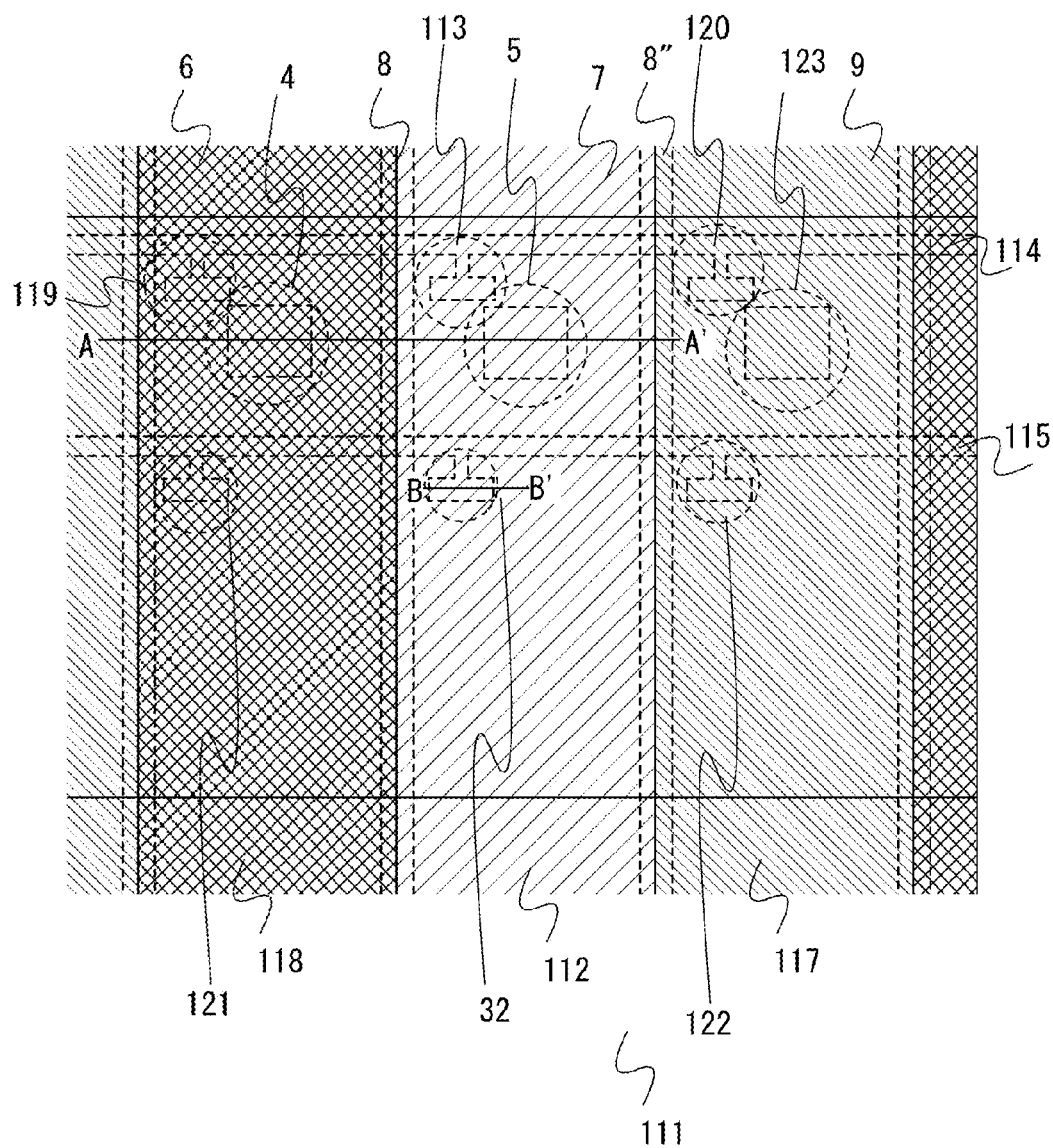
FIG. 7 is a diagram showing Embodiment 2 which is one embodiment of the present invention.

FIG. 7 shows a schematic top view of a pixel portion 111 of the liquid crystal display device. The photodetection portion 101 in FIG. 6 corresponds to a section A-A' in FIG. 7, and the display portion 102 corresponds to a section B-B' in FIG. 7. A pixel 112 in the pixel portion 111 includes at least the second color filter 7, the second photodiode 5, a transistor 113 which switches the second photodiode 5, and the transistor 32 connected to the pixel electrode 51. Similarly, a pixel 118 includes at least the first color filter 6, the first photodiode 4, a transistor 119, and a transistor 121; and a pixel 117 includes at least the third color filter 9, a photodiode 123, a transistor 120, and a transistor 122. Further, the pixel portion 111 is provided with a first scan line 114 connected to the gates of the transistors 113, 119, and 120; first to third signal lines (not illustrated) connected to the sources or drains of the transistors 113, 119, and 120; a second scan line 115 connected to the gates of the transistors 32, 121, and 122; and fourth to sixth signal lines (not illustrated) connected to the sources or drains of the transistors 32, 121, and 122.

Further, the pixels 112, 117, and 118 can each have a storage capacitor.

The third light-blocking layer 8 is formed using the first color filter 6 and the second color filter 7 which are arranged sided by side. The third light-blocking layer 8 is formed in parallel to the first to sixth signal lines. The first to sixth signal lines are formed over or below the third light-blocking layer 8.

Figure 8:
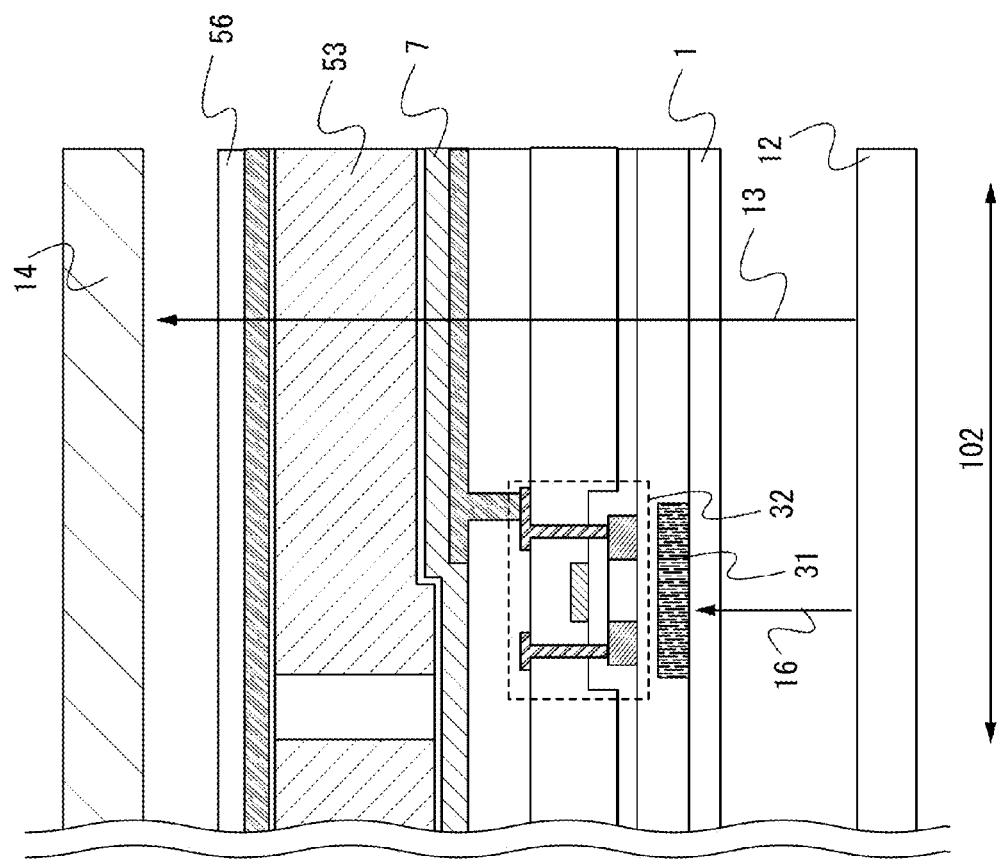
FIG. 8 is a diagram showing Embodiment 2 which is one embodiment of the present invention.
Figure 9:
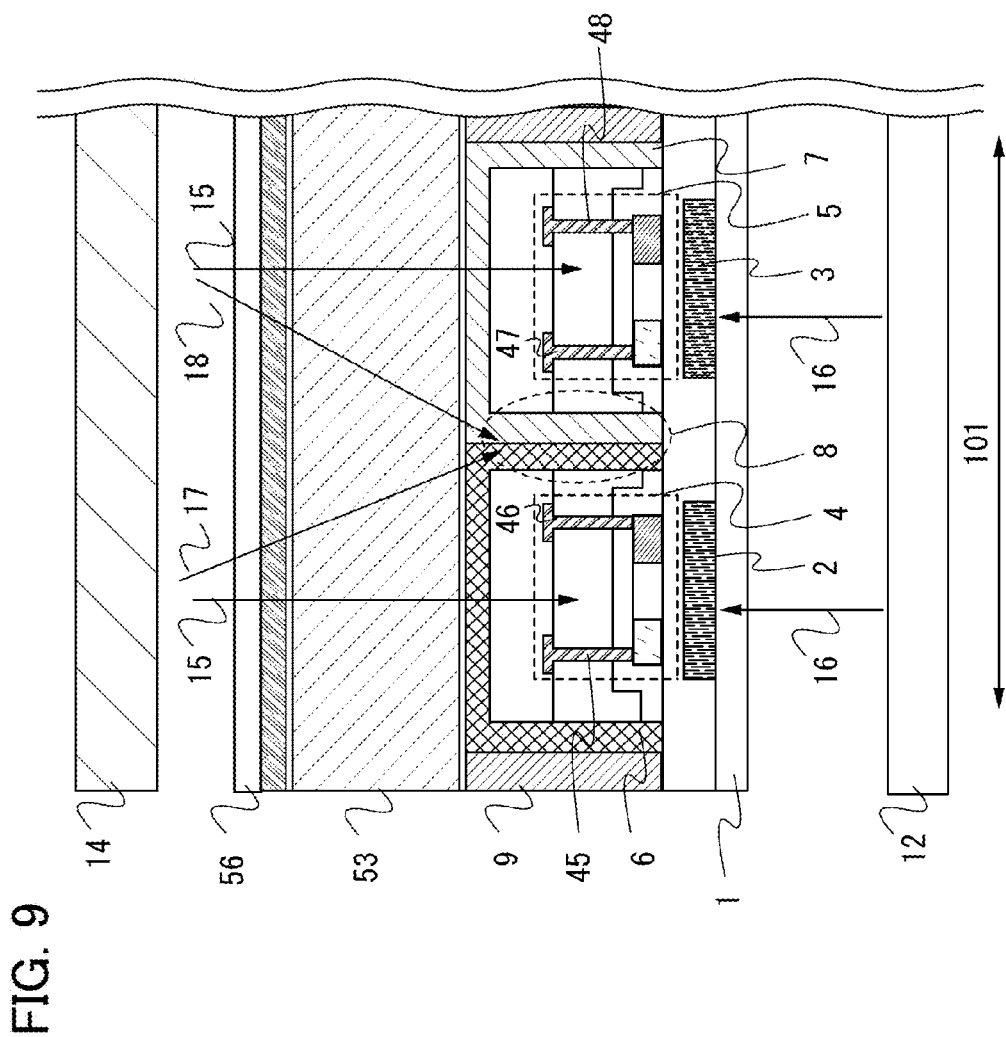
FIG. 9 is a diagram showing Embodiment 2 which is one embodiment of the present invention.

A method of displaying and a method of detecting light will be described below (FIG. 8 and FIG. 9). These are basically the same methods as those in Embodiment 1. The light 13 emitted from the backlight 12 which is below the light-transmitting substrate 1 passes through the light-transmitting substrate 1, the second color filter 7, and the liquid crystal layer 53 which are in the display portion 102, and then the light 13 is reflected off the object 14. At the time, the transistor 32 turns on or off, and the liquid crystal layer 53 is ready for transmitting light (FIG. 8). The reflected light 15 passes through the liquid crystal layer 53 again and is detected by the second photodiode 5 in the photodetection portion 101. A detected light is converted into an electrical signal by the second photodiode 5 and is extracted via the extracting electrodes 47 and 48 (FIG. 9). Further, the light 13 emitted from the backlight 12 passes through the first color filter 6 and the liquid crystal layer 53 in the display portion 102, and is reflected off the object 14. The reflected light 15 passes through the liquid crystal layer 53 again and is detected by the first photodiode 4 in the photodetection portion 101. The detected light is converted into an electrical signal by the first photodiode 4 and is extracted via the extracting electrodes 45 and 46 (FIG. 9).

The oblique light 17 which is part of the reflected light from the object 14 is blocked by the third light-blocking layer 8, and hence does not enter the second photodiode 5 and is not detected by the second photodiode 5. In addition, the oblique light 18 is blocked by the third light-blocking layer 8, and hence does not enter the first photodiode 4 and is not detected by the first photodiode 4. The third light-blocking layer 8 can reliably block the oblique light 17 and the oblique light 18 (FIG. 9).

The light 13 can be colored by the first color filter 6, the second color filter 7, and the third color filter 9, which allows the photodetector to be used as a color sensor.

Note that as described in Embodiment 1, when the liquid crystal layer 53 which is over the photodetection portion 101 (over the first photodiode 4 or the second photodiode 5) transmits light, the light passes through the first color filter 6 or the second color filter 7, and the liquid crystal layer 53 which are over the first photodiode 4 or the second photodiode 5, and is reflected off the object 14. Then, the light is detected by the first photodiode 4 or the second photodiode 5.

Part of the light 13 from the backlight 12 becomes the light 16 heading to the first photodiode 4, the second photodiode 5, and the transistor 32. However, the light 16 is blocked by the first light-blocking layer 2, the second light-blocking layer 3, and the light-blocking layer 31 (FIG. 8 and FIG. 9). Therefore, the light 16 does not enter the first photodiode 4, the second photodiode 5, and the transistor 32, and hence is not detected. Further, the multiple reflection of light from the backlight 12 which occurs in the light-transmitting substrate 1 does not cause the light to enter the first photodiode 4 and the second photodiode 5 because of the first light-blocking layer 2 and the second light-blocking layer 3.

The first light-blocking layer 2 and the second light-blocking layer 3 can be the first reflecting layer 2 and the second reflecting layer 3. In this case, the light 16 from the backlight 12 is reflected off the first reflecting layer 2 and the second reflecting layer 3, and hence is not detected by the first photodiode 4 and the second photodiode 5.

Further, even when the light 15 from the object 14 has not been detected by the first photodiode 4 or the second photodiode 5, the light is reflected off the first reflecting layer 2 or the second reflecting layer 3, which allows the light from the object 14 to be detected more easily by the first photodiode 4 or the second photodiode 5. Note that the transistor 32 does not need to detect light, and hence the light-blocking layer 31 does not serve as a reflecting layer.

In addition, preferably, the second light-transmitting substrate 56 has a thickness of 70 to 100 μm which prevents light which is due to multiple reflection from entering the second photodiode 5, because it is possible that the multiple reflection of the light 13 from the backlight 12 occurs in the second light-transmitting substrate 56 and the light 13 is detected by the second photodiode 5.

The elements of the display device will be described below.
(1) The Light-transmitting Substrate 1 and the Second Light-transmitting Substrate 56

The light-transmitting substrate 1 is the same as that in Embodiment 1. Further, as the second light-transmitting substrate 56, a similar one to the light-transmitting substrate 1 can be used. Preferably, the second light-transmitting substrate 56 is formed to a thickness of 70 to 100 μm by mechanical polishing, chemical polishing, etching, or the like.
(2) The First Light-blocking Layer 2, the Second Light-Blocking Layer 3, and the Light-blocking Layer 31

The first light-blocking layer 2 and the second light-blocking layer 3 are the same as those in Embodiment 1. In addition, the light-blocking layer 31 can be formed using similar one to the first light-blocking layer 2 and the second light-blocking layer 3. In addition, when the first reflecting layer 2 and the second reflecting layer 3 are used as the first light-blocking layer 2 and the second light-blocking layer 3, they are the same as those in Embodiment 1.
(3) The Transistors 32, 121, 122, 113, 119, and 120

The transistors 32, 121, and 122 are switches which allow or do not allow liquid crystal in the liquid crystal layer 53 to transmit light. The transistors 113, 119, and 120 turn on and off the second photodiode 5, the first photodiode 4, and the photodiode 123, respectively. These transistors are the same as those described above. The semiconductor layers of these transistors are formed using films made of semiconductor such as silicon or oxide semiconductor films containing ZnO or the like. The semiconductor film can have any of amorphous, microcrystalline, crystalline, and single crystalline structures.

(4) The First Photodiode 4, the Second Photodiode 5, and the Photodiode 123

The first photodiode 4 and the second photodiode 5 are the same as those in Embodiment 1. Further, the same photodiode as that used as the first photodiode 4 or the second photodiode 5 is used as the photodiode 123.

(5) The First Color Filter 6, the Second Color Filter 7, and the Third Color Filter 9

The first color filter 6, the second color filter 7, and the third color filter 9 are the same as those in Embodiment 1.

(6) The Third Light-Blocking Layer 8

The third light-blocking layer 8 is the same as that in Embodiment 1.

(7) The First Light-Transmitting Insulating Film 10, the Light-Transmitting Insulating Film 42, the Light-transmitting Insulating Film 44, and the Light-Transmitting Insulating Film 49

The first light-transmitting insulating film 10 is the same as that in Embodiment 1. The light-transmitting insulating film 42 is a gate insulating film. The light-transmitting insulating film 42 is formed using an insulating material such as silicon oxide, silicon nitride, silicon oxynitride, and silicon nitride oxide. The light-transmitting insulating film 42 is formed by CVD, sputtering, thermal oxidation, thermal nitridation, plasma oxidation, plasma nitridation, coating, or the like. Preferably, the light-transmitting insulating film 44 and the light-transmitting insulating film 49 are flat insulating films. Each of the light-transmitting insulating film 44 and the light-transmitting insulating film 49 is a single-layer or multilayer film using any of a silicon oxide film, a silicon oxynitride film, a silicon nitride oxide film, an organic resin film, or the like. The light-transmitting insulating film 44 and the light-transmitting insulating film 49 are formed by CVD, sputtering, coating, or the like.

(8) The Pixel Electrode 51 and the Counter Electrode 55

The pixel electrode 51 and the counter electrode 55 are light-transmitting electrodes, and are formed using a material such as indium tin oxide (ITO), indium tin oxide containing silicon oxide (ITSO), or indium zinc oxide (IZO).

(9) The Alignment Films 52 and 54

The alignment films 52 and 54 align liquid crystal molecules in the liquid crystal layer 53 in one direction. The alignment films 52 and 54 are formed by coating, heat treatment, and rubbing. The alignment films 52 and 54 are formed using polyimide or the like. The alignment films 52 and 54 are not necessarily formed if there is another way to align the liquid crystal molecules in one direction.

(10) The Liquid Crystal Layer 53

The liquid crystal layer 53 is a switch allowing or not allowing the light 13 from the backlight 12 and the reflected light 15 from the object 14 to pass through the liquid crystal layer 53, by a combination with a polarizing film which is not illustrated. The liquid crystal layer 53 can include TN (twisted nematic) liquid crystals, VA (vertical alignment) liquid crystals, OCB (optically compensated birefringence) liquid crystals, IPS (in-plane switching) liquid crystals, or the like.

(11) The Spacer 57

The spacer 57 maintains a uniform thickness of the liquid crystal layer 53. The spacer 57 is formed using an organic resin, glass bead, or the like.

(12) The First Scan Line 114, the Second Scan Line 115, and the First to Sixth Signal Lines The first scan line 114 is connected to the gates of the transistors 113, 119, and 120, inputs a signal from a driver circuit to the gates, and controls whether the transistors 113, 119, and 120 are turned on or off. The first to third signal lines are connected to the sources or drains of the transistors 113, 119, and 120, respectively, and transmit a signal detected by the second photodiode 5, the first photodiode 4, and the photodiode 123 to an external circuit. The second scan line 115 is connected to the gates of the transistors 32, 121, and 122, inputs a signal from a driver circuit to the gates, and controls whether the transistors 32, 121, and 122 are turned on or off. The fourth to sixth signal lines are connected to the sources or drains of the transistors 32, 121, and 122, respectively, and input a data signal from another driver circuit to the sources or drains of the transistors 32, 121, and 122. The first scan line 114, the second scan line 115, and the first to sixth signal lines are formed using a known material.

A method of fabricating the liquid crystal display device will be described below. The liquid crystal display device can be made basically by the method described in Embodiment 1.

The first light-blocking layer 2, the second light-blocking layer 3, and the light-blocking layer 31 are formed over the first light-transmitting substrate 1 by the method in Embodiment 1. The first light-transmitting insulating film 10 is formed over the first light-transmitting substrate 1, the first light-blocking layer 2, the second light-blocking layer 3, and the light-blocking layer 31. The first light-transmitting insulating film 10 can be made by the method in Embodiment 1.

The first photodiode 4, the second photodiode 5, and the transistor 32 are formed over the first light-transmitting insulating film 10. The first photodiode 4 and the second photodiode 5 are formed by the method in Embodiment 1. If the first photodiode 4 and the second photodiode 5 are lateral diodes, they can be made by the same steps as those of making the transistor 32. This will be described below.

A semiconductor film is formed over the first light-transmitting insulating film 10 by CVD, sputtering, or the like. After that, the crystallinity of the semiconductor film can be improved by heat treatment, laser irradiation, or the like.

Note that the semiconductor film can be also formed by bonding and separating. First, hydrogen ions ($H^+$, $H_2^+$, $H_3^+$, or the like) or a set of hydrogen ions and helium ions are added into a semiconductor wafer such as a silicon wafer, forming a brittle layer in the semiconductor wafer. The semiconductor wafer is bonded to the top surface of the first light-transmitting insulating film 10 and is separated along the brittle layer by heat treatment, so that a semiconductor film over the first light-transmitting insulating film 10 is formed. The depth from the surface of the semiconductor wafer to the brittle layer corresponds to the thickness of the semiconductor film; therefore, the thickness of the semiconductor film can be adjusted by controlling the conditions of the addition of hydrogen ions or the like. Further, when the semiconductor wafer is single crystalline, a single crystal semiconductor film can be formed.

The semiconductor layer 103, the semiconductor layer 104, and the semiconductor layer 105 are formed by processing the semiconductor film by photolithography and etching.

The light-transmitting insulating film (gate insulating film) 42 is formed over the semiconductor layer 103, the semiconductor layer 104, and the semiconductor layer 105 in the manner described above.

A metal film is formed over the light-transmitting insulating film 42. The metal film is processed by photolithography and etching, so that the gate electrode 43 is formed over the semiconductor layer 105 with the gate insulating film interposed therebetween.

P-type or n-type impurity ions are selectively added to the semiconductor layer 103, the semiconductor layer 104, and the semiconductor layer 105, so that the p-type layer 33, the n-type layer 35, the p-type layer 36, the n-type layer 38, the source region 39, and the drain region 41 are formed.

Next, the light-transmitting insulating film 44 is formed over the light-transmitting insulating film 42 and the gate electrode 43. After contact holes are formed in the light-transmitting insulating film 42 and the light-transmitting insulating film 44, the electrode 45, the electrode 46, the electrode 47, the electrode 48, the source electrode 106, and the drain electrode 107 are formed. Thus, the first photodiode 4, the second photodiode 5, and the transistor 32 are formed.

Next, the flat light-transmitting insulating film 49 is formed over the light-transmitting insulating film 44, the electrode 45, the electrode 46, the electrode 47, the electrode 48, the source electrode 106, and the drain electrode 107. A contact hole is formed in the light-transmitting insulating film 49. The contact hole reaches the drain electrode 107 and is used for forming the pixel electrode. Further, a groove which reaches the first light-transmitting insulating film 10 and is used for forming the third light-blocking layer 8 is formed in the light-transmitting insulating films 49, 44, and 42.

The pixel electrode 51 to be connected to the drain electrode 107 is formed over the light-transmitting insulating film 49.

The first color filter 6 is formed in the pixel 118 by the method in Embodiment 1. The first color filter 6 is also formed in the groove described above. Next, the second color filter 7 is formed in the pixel 112. The second color filter 7 is also formed in the groove described above. The third light-blocking layer 8 is formed so as to fill the groove. Similarly, the third color filter 9 is formed in the pixel 117. The third light-blocking layer 8" formed using the second color filter 7 and the third color filter 9, and the third light-blocking layer 8' formed using the first color filter 6 and the third color filter 9 are formed in respective grooves.

Next, the alignment film 52 is formed over the first color filter 6, the second color filter 7, and the third color filter 9, and then subjected to rubbing. The alignment film 52 is not necessarily formed if there is another way to align the liquid crystal molecules in one direction.

The spacer 57 is formed over the alignment film 52. An organic resin is applied over a top surface of the alignment film 52 and then processed by photolithography and etching to form the spacer 57. Instead of the spacer 57, spherical spacers may be dispersed.

The liquid crystal layer 53 is formed by dropping liquid crystal onto the alignment film 52. Alternatively, after the first light-transmitting substrate 1 and the second light-transmitting substrate 56 are bonded to each other, injection of liquid crystal can be performed by a vacuum injection method.

The counter electrode 55 and the alignment film 54 are formed on the second light-transmitting substrate 56. After that, the first light-transmitting substrate 1 and the second light-transmitting substrate 56 are bonded to each other such that the alignment film 54 and the liquid crystal layer 53 are in contact with each other. In such a manner, the liquid crystal display device can be fabricated.

(Embodiment 3)

Figure 10:
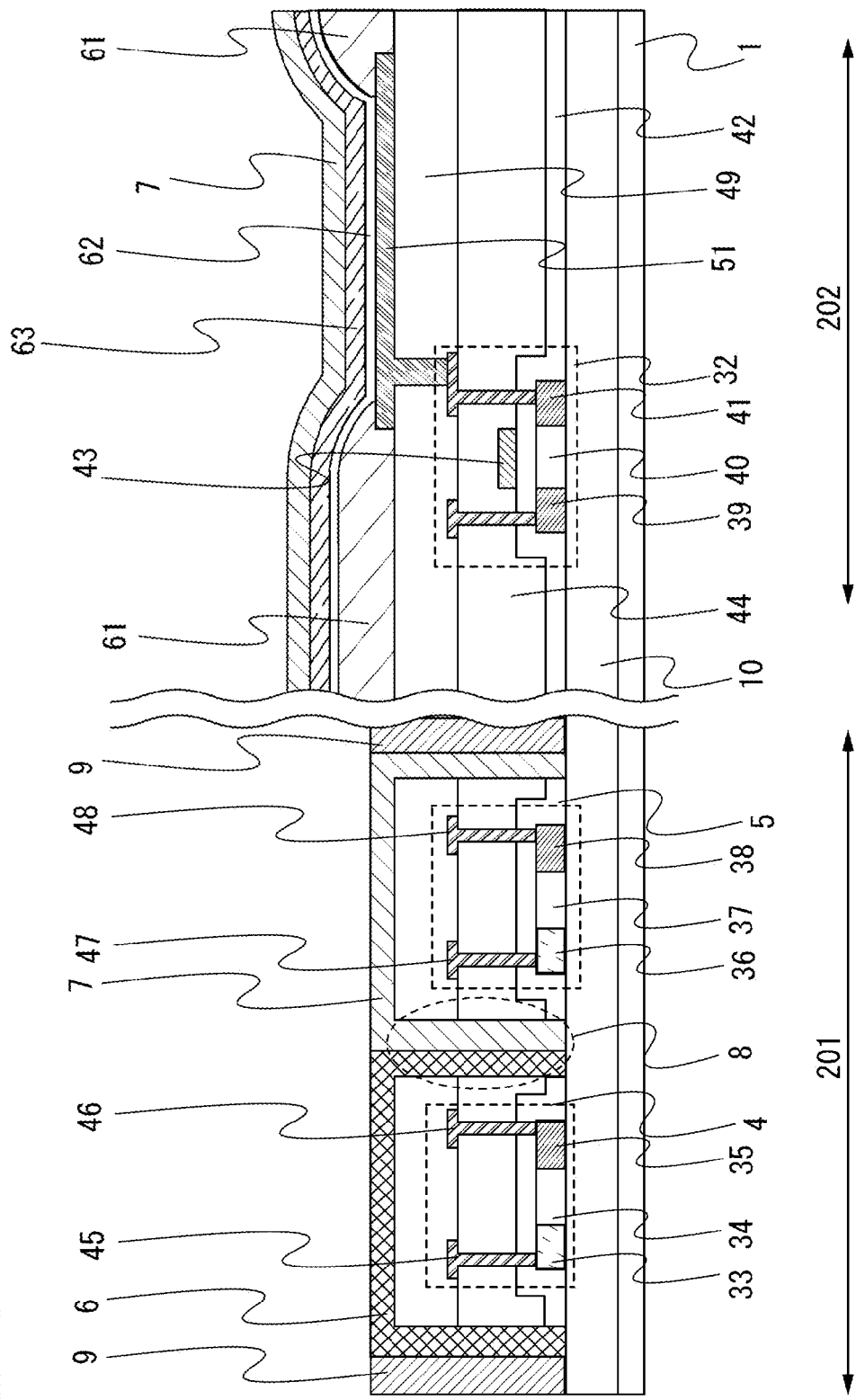
FIG. 10 is a diagram showing Embodiment 3 which is one embodiment of the present invention.

A light-emitting device which is one embodiment of the present invention will be described below (FIG. 10). FIG. 10 is a cross-sectional view of the light-emitting device. The liquid crystal display device in Embodiment 2 and the light-emitting device in Embodiment 3 are different in that the liquid crystal display device in Embodiment 2 includes the liquid crystal layer, the first light-blocking layer 2, the second light-blocking layer 3, and the light-blocking layer 31, while the light-emitting device in Embodiment 3 includes an electroluminescent (EL) layer and hence does not need to include the first light-blocking layer 2, the second light-blocking layer 3, and the light-blocking layer 31. The display device in the Embodiment 2 and the light-emitting device in Embodiment 3 are also different in the method of detecting light: the display device in the Embodiment 2 uses the backlight, while the light-emitting device in Embodiment 3 uses an EL layer instead of a backlight.

The light-emitting device which is one embodiment of the present invention includes the first photodiode 4, the second photodiode 5, and a light-emitting layer 62 over the substrate; and includes the first color filter 6, the second color filter 7, or the third color filter 9 over the light-emitting layer 62. The first color filter 6 covers the first photodiode 4, and the second color filter 7 covers the second photodiode 5. The light-emitting device includes the light-blocking layer 8 formed using the first color filter 6 and the second color filter 7, between the first photodiode 4 and the second photodiode 5.

The light-emitting device in FIG. 10 includes a photodetection portion 201 and a display portion 202. The photodetection portion 201 has the same structure as that in Embodiments 1 and 2.

The display portion 202 includes, over the light-transmitting substrate (the first light-transmitting substrate) 1, the transistor 32; the pixel electrode 51 connected to the transistor 32; a partition 61 formed using an insulating film covering an end of the pixel electrode 51; the light-emitting layer 62 over the pixel electrode 51; a light-transmitting electrode 63 over the light-emitting layer 62; and the first color filter 6, the second color filter 7, or the third color filter 9 over the light-transmitting electrode 63.

The transistor 32 is the same as that in Embodiment 2. The transistor 32 supplies a current to the light-emitting layer 62, and controls the amount of current to be supplied. The display portion 202 is provided with an additional transistor which is not illustrated. One of the source and drain of the additional transistor is connected to the gate electrode 43 of the transistor 32; thus, the additional transistor serves as a switch which controls whether the transistor 32 is turned on or off. In addition, a storage capacitor for maintaining the potential of the gate electrode 43 of the transistor 32 can be formed.

The partition 61 is used for partitioning the pixel portion. The partition 61 is provided between adjacent pixels. The partition 61 is formed using an inorganic or organic insulating film.

The light-emitting layer 62 is sandwiched between the pixel electrode 51 and the light-transmitting electrode 63. The light-emitting layer 62 emits light when supplied with current. Preferably, the light-emitting layer 62 emits white light. The light-emitting layer 62 can be formed using an organic or inorganic known material. In addition, the pixel electrode 51 is not necessarily capable of transmitting light. Preferably, the pixel electrode 51 reflects light emitted from the light-emitting layer 62.

The first color filter 6, the second color filter 7, and the third color filter 9 are the same as those in Embodiments 1 and 2.

Figure 11:
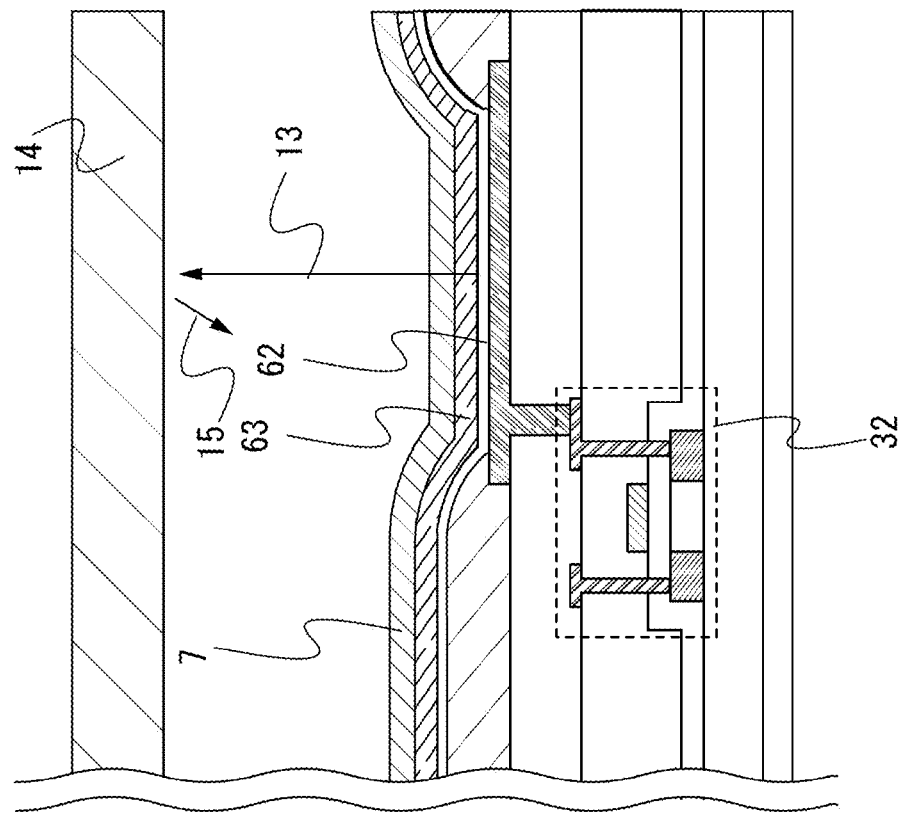
FIG. 11 is a diagram showing Embodiment 3 which is one embodiment of the present invention.
Figure 12:
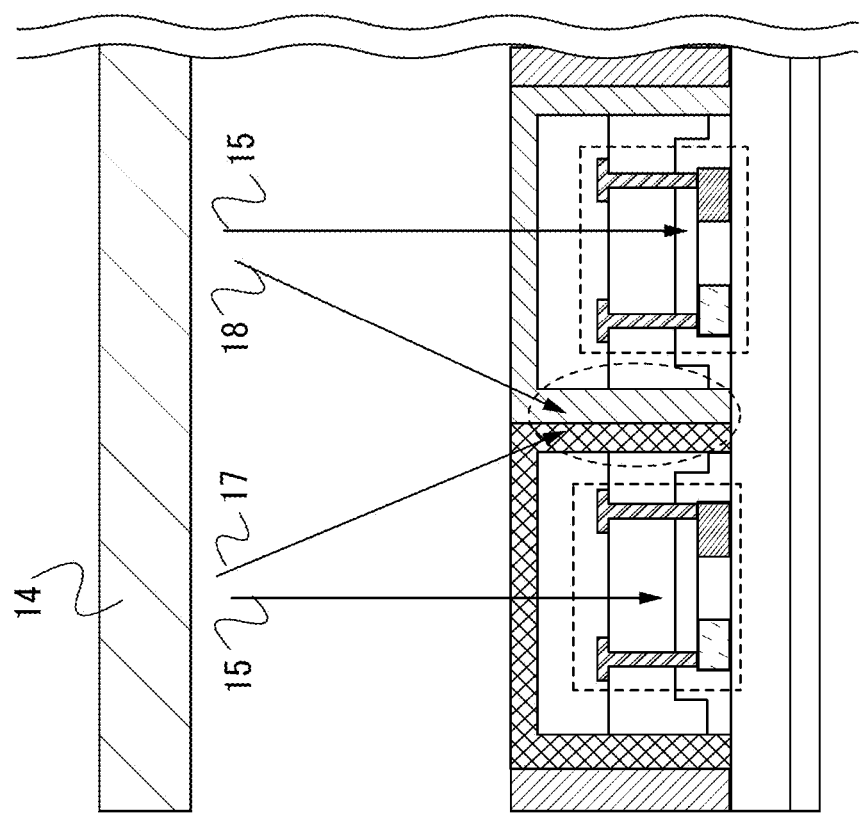
FIG. 12 is a diagram showing Embodiment 3 which is one embodiment of the present invention.

A method of displaying and a method of detecting light will be described below (FIG. 11 and FIG. 12). These are basically the same methods as those in Embodiments 1 and 2.

White light 13 emitted from the light-emitting layer 62 passes through the light-transmitting electrode 63 and one of the first color filter 6, the second color filter 7 and the third color filter 9, and then reflected off the object 14 (FIG. 11). Note that FIG. 11 shows the second color filter 7. At the time, the transistor 32 is turned on, and current is supplied to the light-emitting layer 62. The light 15 reflected off the object 14 is detected by the second photodiode 5 in the photodetection portion 201. Detected light is converted into an electrical signal by the second photodiode 5 and is extracted via the extracting electrodes 47 and 48. Further, the light 15 that passes through the first color filter 6 in the display portion 202 and is reflected off the object 14 is detected by the first photodiode 4 in the photodetection portion 201. Detected light is converted into an electrical signal by the first photodiode 4 and is extracted via the extracting electrodes 45 and 46.

The white light 13 can be colored by the first color filter 6, the second color filter 7, and the third color filter 9, which allows the light-emitting device to display color image and to be used as a color sensor.

The oblique light 17 which is part of the reflected light from the object 14 is blocked by the third light-blocking layer 8. Thus, the oblique light 17 does not enter the second photodiode 5, and hence is not detected. Further, the oblique light 18 is blocked by the third light-blocking layer 8. Thus, the oblique light 18 does not enter the first photodiode 4, and hence is not detected. The third light-blocking layer 8 can reliably block the oblique light 17 and the oblique light 18 (FIG. 12).

Note that in this embodiment, since a backlight is not used, the first light-blocking layer 2, the second light-blocking layer 3, and the light-blocking layer 31 are not necessarily formed. However, in the case where the multiple reflection of light from the light-emitting layer 62 occurs in the first light-transmitting substrate 1 and thus the light enters the first photodiode 4, the second photodiode 5, and the transistor 32, the first light-blocking layer 2, the second light-blocking layer 3, and the light-blocking layer 31 are preferably formed.

In addition, as the first light-blocking layer 2 and the second light-blocking layer 3, the first reflecting layer 2 and the second reflecting layer 3 can be formed. In this case, even when the light 15 from the object 14 has not been detected by the first photodiode 4 or the second photodiode 5, the light is reflected off the first reflecting layer 2 or the second reflecting layer 3, which allows the light from the object 14 to be detected more easily by the first photodiode 4 or the second photodiode 5.

A method of fabricating the light-emitting device will be described below. The method of fabricating the light-emitting device is the same as that in Embodiment 2 except for the steps performed after the step of forming the pixel electrode 51.

An organic resin film or an inorganic insulating film is formed over the pixel electrode 51 and processed by photolithography and etching, so that the partition 61 is formed.

The light-emitting layer 62 is formed over the pixel electrode 51 by vapor deposition, droplet discharge method, or the like.

The light-transmitting electrode 63 is formed over the light-emitting layer 62 by sputtering, vapor deposition, or the like.

The first color filter 6 is formed by the method in Embodiments 1 and 2. The first color filter 6 is also formed in the groove in the insulating films 42, 44, and 49. Next, the second color filter 7 is formed. The second color filter 7 is also formed in the groove described above. The third light-blocking layer 8 formed using the first color filter 6 and the second color filter 7 is formed so as to fill the groove. Similarly, the third color filter 9 is formed. The third light-blocking layer 8" formed using the second color filter 7 and the third color filter 9, and the third light-blocking layer 8' formed using the first color filter 6 and the third color filter 9 are formed in respective grooves.

The light-emitting device can be fabricated in such a manner. The light-emitting layer 62 can be degraded by moisture; therefore, a sealing member can be additionally provided over the first color filter 6, the second color filter 7, and the third color filter 9.

(Embodiment 4)

In this embodiment, example applications of the photodetector, the liquid crystal display device, and the light-emitting device to electronic appliances will be described (FIGS. 13A to 13F).

Figure 13C:
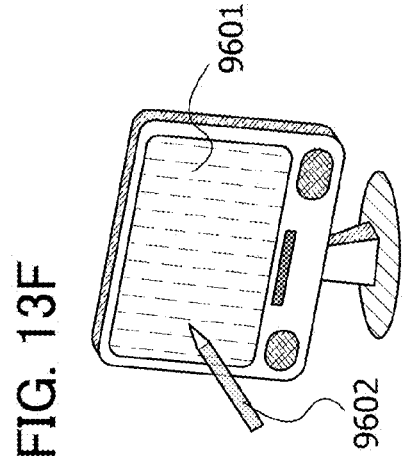
FIGS. 13A to 13F are diagrams showing Embodiment 4 which is one embodiment of the present invention.
Figure 13F:
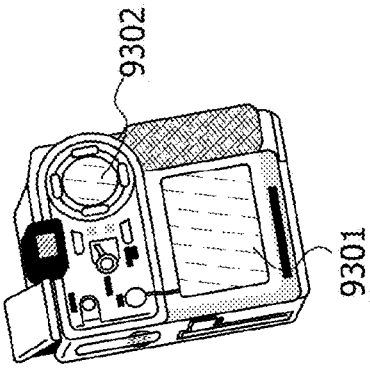
Figure 13B:
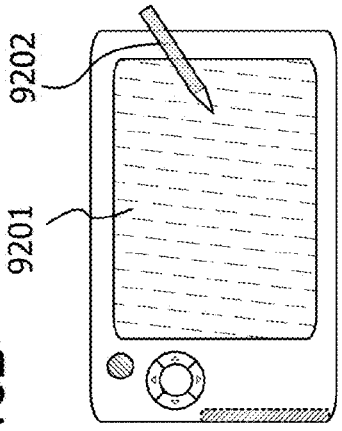
Figure 13E:
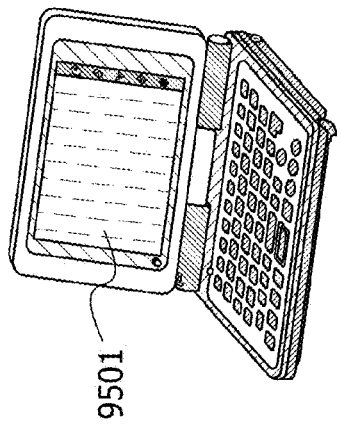
Figure 13A:
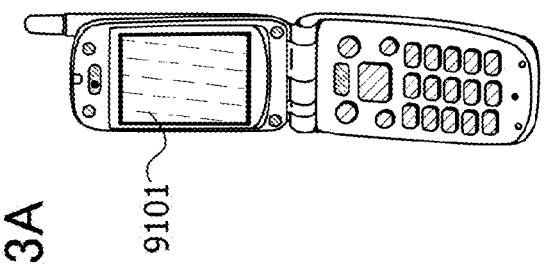
Figure 13D:
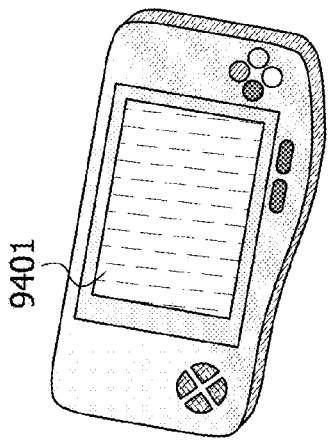

A mobile phone in FIG. 13A includes a display portion 9101. A personal digital assistant in FIG. 13B includes a display portion 9201, an input pen 9202, and the like. A digital video camera in FIG. 13C includes a display portion 9301, a display portion 9302, and the like. A portable game console in FIG. 13D includes a display portion 9401 and the like. A personal digital assistant in FIG. 13E includes a display portion 9501 and the like. A personal digital assistant in FIG. 13E includes a display portion 9501 and the like. A television in FIG. 13F includes a display portion 9601, an input pen 9602, and the like. The photodetector, the liquid crystal display device, and the light-emitting device, each of which is one embodiment of the present invention can be used as touch panels used in the display portions. By using those as touch panels, touch panels capable of data sensing with high sensitivity can be provided.

(Embodiment 5)

An example of a writing board (blackboard, whiteboard, or the like) using a liquid crystal display device or light-emitting device that includes a photodiode will be described.

Figure 14:
FIG. 14 is a diagram showing Embodiment 5 which is one embodiment of the present invention.

For example, the liquid crystal display device including a photodiode in the above embodiment or light-emitting device including a photodiode in the above embodiment is provided at the position of a panel 9696 in FIG. 14.

Here, it is possible to freely write down letters or the like on the surface of the panel 9696, with a marker pen or the like.

Note that it is easy to erase letters if the letters are written with a marker pen or the like without fixer.

In addition, preferably, the surface of the panel 9696 is adequately smooth in order that the ink of marker pen may easily be removed.

For example, the surface of the panel 9696 is adequately smooth if made using a glass substrate or the like.

Further, a transparent sheet of synthetic resin or the like can be laminated to the surface of the panel 9696.

Preferably, acrylic resin, for example, is used as the synthetic resin. In this case, the surface of the sheet of synthetic resin is preferably smooth.

In addition, since the panel 9696 includes a display element, the panel 9696 can display a particular image and at the same time, it is possible to write down letters or the like on the surface of the panel 9696 with a marker pen.

Further, since the panel 9696 includes a photodiode, the panel 9696 can read out and print out letters written with a marker pen if connected to a printer or the like.

Further, since the panel 9696 includes the liquid crystal display device including a photodiode or light-emitting device including a photodiode, by writing down letters or the like or drawing a graphic and the like on the surface of the panel 9696 while the panel 9696 displays an image, the panel 9696 can display a trail of a marker, which has been read out by the photodiode, superimposed on the image.

Note that sensing with resistive touch sensors, capacitive touch sensors, or the like can be performed only at the same time as writing with a marker pen or the like.

Meanwhile, sensing with a photodiode is superior in that it can be performed anytime even long after writing has been done with a marker pen or the like.

Note that this embodiment can be freely combined with any of the other embodiments.

This application is based on Japanese Patent Application serial no. 2009-191827 filed with Japan Patent Office on Aug. 21, 2009, the entire contents of which are hereby incorporated by reference.

What is claimed is:

1. A semiconductor device comprising:
   a first light-transmitting insulating layer over a light-transmitting substrate;
   a photodiode over and in contact with the first light-transmitting insulating layer, the photodiode comprising an oxide semiconductor film;
   a second light-transmitting insulating layer over and covering the photodiode;
   a first color filter over and covering the second light-transmitting insulating layer, the first color filter in contact with the first light-transmitting insulating layer; and
   a second color filter in contact with the first light-transmitting insulating layer and the first color filter.

2. The semiconductor device according to claim 1, further comprising:
   a light-blocking layer between the light-transmitting substrate and the first light-transmitting insulating layer,
   wherein the photodiode overlaps with the light-blocking layer.

3. The semiconductor device according to claim 2, wherein the light-blocking layer is a reflecting layer.

4. The semiconductor device according to claim 1, further comprising:
   a liquid crystal layer over the first color filter and the second color filter; and
   a substrate over the liquid crystal layer.

5. The semiconductor device according to claim 1, wherein the light-transmitting substrate has flexibility.

6. The semiconductor device according to claim 1, wherein the photodiode is a vertical diode.

7. A semiconductor device comprising:
   a first light-transmitting insulating layer over a light-transmitting substrate;
   a photodiode over and in contact with the first light-transmitting insulating layer, the photodiode comprising a first oxide semiconductor film;
   a transistor comprising a second oxide semiconductor film over and with the first light-transmitting insulating layer;
   a second light-transmitting insulating layer over and covering the photodiode;
   a first color filter over and covering the second light-transmitting insulating layer, the first color filter in contact with the first light-transmitting insulating layer; and
   a second color filter in contact with the first light-transmitting insulating layer and the first color filter.

8. The semiconductor device according to claim 7, further comprising:
   a light-blocking layer between the light-transmitting substrate and the first light-transmitting insulating layer,
   wherein the photodiode overlaps with the light-blocking layer.

9. The semiconductor device according to claim 8, wherein the light-blocking layer is a reflecting layer.

10. The semiconductor device according to claim 7, further comprising:
    a light-blocking layer between the light-transmitting substrate and the first light-transmitting insulating layer,
    wherein the second semiconductor layer overlaps with the light-blocking layer.

11. The semiconductor device according to claim 7, further comprising:
    a liquid crystal layer over the first color filter and the second color filter; and
    a substrate over the liquid crystal layer.

12. The semiconductor device according to claim 7, wherein the light-transmitting substrate has flexibility.

13. The semiconductor device according to claim 7, wherein the photodiode is a vertical diode.

14. A semiconductor device comprising:
    a first light-transmitting insulating layer over a light-transmitting substrate;
    a first photodiode over and in contact with the first light-transmitting insulating layer, the first photodiode comprising a first oxide semiconductor film;
    a second photodiode over and in contact with the first light-transmitting insulating layer, the second photodiode comprising a second oxide semiconductor film;
    a second light-transmitting insulating layer over the first photodiode and the second photodiode, the second light-transmitting insulating layer covering the first photodiode and the second photodiode;
    a groove in the second light-transmitting insulating layer, the groove reaching the first light-transmitting insulating layer;
    a first color filter in the groove, the first color filter in contact with the first light-transmitting insulating layer; and
    a second color filter in the groove, the second color filter in contact with the first light-transmitting insulating layer and the first color filter,
    wherein the groove is positioned between the first photodiode and the second photodiode.

15. The semiconductor device according to claim 14, further comprising:
    a first light-blocking layer and second light-blocking layer between the light-transmitting substrate and the first light-transmitting insulating layer,
    wherein the first photodiode overlaps with the first light-blocking layer, and
    wherein the second photodiode overlaps with the second light-blocking layer.

16. The semiconductor device according to claim 15, wherein each of the first light-blocking layer and the second light-blocking layer is a reflecting layer.

17. The semiconductor device according to claim 14, further comprising:
    a transistor comprising a third oxide semiconductor film over and with the first light-transmitting insulating layer.

18. The semiconductor device according to claim 14, further comprising:
    a liquid crystal layer over the first color filter and the second color filter; and
    a substrate over the liquid crystal layer.

19. The semiconductor device according to claim 14, wherein the light-transmitting substrate has flexibility.

20. The semiconductor device according to claim 14, wherein each of the first photodiode and the second photodiode is a vertical diode.

* * * * *